United States Patent
Jang

(10) Patent No.: US 6,284,635 B1
(45) Date of Patent: Sep. 4, 2001

(54) METHOD FOR FORMING TITANIUM POLYCIDE GATE

(75) Inventor: Se Aug Jang, Kyoungki-do (KR)

(73) Assignee: Hyundai Electronics Industries Co., Ltd., Kyoungki-do (KR)

( * ) Notice: Subject to any disclaimer, the term of this patent is extended or adjusted under 35 U.S.C. 154(b) by 0 days.

(21) Appl. No.: 09/471,596

(22) Filed: Dec. 23, 1999

(30) Foreign Application Priority Data

Dec. 28, 1998 (KR) .................................................. 98-59168

(51) Int. Cl.$^7$ ................................................ H01L 21/3205
(52) U.S. Cl. .......................... 438/592; 438/652; 438/656; 438/657; 438/659
(58) Field of Search ................................ 438/532, 592, 438/630, 647, 651, 652, 655, 656, 657, 659, 660

(56) References Cited

U.S. PATENT DOCUMENTS

| | | | |
|---|---|---|---|
| 4,635,347 | 1/1987 | Lien et al. | 29/591 |
| 4,900,257 | 2/1990 | Maeda | 437/200 |
| 5,508,212 | 4/1996 | Wang et al. | 437/24 |
| 5,668,394 | 9/1997 | Lur et al. | 257/413 |
| 5,677,217 | 10/1997 | Tseng | 437/45 |
| 5,731,239 | * 3/1998 | Wong et al. | 438/296 |
| 5,744,395 | 4/1998 | Shue et al. | 438/305 |
| 5,747,373 | 5/1998 | Yu | 438/305 |
| 5,811,354 | 9/1998 | Yzng | 438/682 |
| 5,858,831 | 1/1999 | Sung | 438/241 |
| 5,879,986 | 3/1999 | Sung | 438/253 |

* cited by examiner

*Primary Examiner*—Charles Bowers
*Assistant Examiner*—Jack Chen
(74) *Attorney, Agent, or Firm*—Ladas & Parry

(57) ABSTRACT

A method for forming a titanium polycide gate, comprising the steps of: forming a gate oxide and a doped polysilicon layer over the semiconductor substrate, in turn; implanting impurity ions into the doped polysilicon layer to form an amorphous phase silicon layer in the surface of the polysilicon layer; forming an amorphous phase titanium silicide layer over the amorphous phase silicon layer; carrying out heat-treatment to transform the amorphous phase titanium silicide layer into a crystalline phase titanium silicide layer and to transform the amorphous phase silicon layer into the crystalline silicon layer; and patterning the crystalline phase titanium silicide layer, the polysilicon layer including the crystalline phase silicon layer and the gate oxide to form the titanium polycide gate.

5 Claims, 4 Drawing Sheets

METHOD FOR FORMING TITANIUM POLYCIDE GATE

BACKGROUND OF THE INVENTION

This invention relates to a method for forming a titanium polycide gate, and more particularly to a method for forming a titanium polycide gate having a good interface roughness between a titanium silicide layer and a polysilicon layer.

A gate of a MOSFET is comprised of polysilicon or polysilicon/tungsten silicide. As the integrity of the device become high, a line width of the gate is reduced so that it is difficult to lower the resistance in the high integration device having a fine line width with a gate material of polysilicon or polysilicon/tungsten silicide.

So as to obtain the gate having a low resistance in the high integration device, as a gate material, polysilicon/metal silicide which is any one of titanium silicide, cobalt silicide or nikel silicide in stack is used in stead of polysilicon or polysilicon/tungsten silicide. In particular, a concentrative study on titanium silicide is progressed, which comparatively has a characteristic of low resistance, high melting point, easy thin layer formation, easy line patterning and thermal stability required as a gate material.

FIG. 1A to FIG. 1C are sectional views illustrating a method for forming a gate using titanium silicide in the prior art. Referring to FIG. 1A, a semiconductor substrate 1 is prepared and a gate oxide 2 and a doped polysilicon layer 3 are formed over the semiconductor substrate 1 in turn. The doped polysilicon layer 3 is doped with phosphorous ions (P) or arsenic ions (As) in accordance with the conductivity of the channel of the MOSFET. A titanium silicide layer (TiSi$_x$) 4 of amorphous phase is formed over the doped polysilicon layer 3 with physical vapor deposition PVD.

Referring to FIG. 1B, a heat treatment is carried out to transform the titanium silicide layer 4 of amorphous phase into a titanium silicide layer (TiSi$_2$) 4a of crystalline phase.

Referring to FIG. 1C, a mask pattern 6 which is comprised of an oxide layer or a nitride layer, is formed over the titanium silicide layer 4a. The titanium silicide 4a, the doped polysilicon 3 and the gate oxide 2 are etched using the mask pattern 6 to form a titanium polycide gate 10 where the polysilicon layer 3 and the titanium silicide layer 4a are in stack.

However, as the following processes are progressed, the characteristic of the titanium polycide gate 10 becomes degraded. For example, as shown in FIG. 2, the titanium polycide gate 10 has a poor interface roughness between the polysilicon layer 3 and the crystalline titanium silicide layer 4a by a heat treatment which is inevitably accompanied in forming a source and drain region and an intermediate insulating layer. Accordingly, the characteristic of the titanium polycide gate 10 becomes deteriorated. It is because titanium of the titanium silicide layer 4a and silicon of the polysilicon layer 3 are reacted. In other word, the polysilicon layer 3 has grain boundaries between grains and a material largely migrates through the grain boundaries rather than grains. Particularly, the polysilicon layer 3 for the titanium polycide gate 10 has a columnar structure having large grains. Accordingly, the material migration through the grain boundaries in the polysilicon layer 3 is relatively larger than that of the polysilicon having a minute grains.

As a result, because the polysilicon layer 3 has a columnar structure, the material migration through the interface between the polysilicon layer 3 and the titanium silicide layer 4a is large so that the interface roughness becomes poor and thus the characteristic of titanium polycide gate 10 is degraded.

Furthermore, when the reaction between the polysilicon layer 3 and the titanium silicide layer 4a is excessive, the titanium silicide layer 4a is contacted with the gate oxide 2 and thus the gate oxide integrity which is a prominent factor becomes degraded.

SUMMARY OF THE INVENTION

It is an object of the present invention to provide a method for forming a titanium polycide gate having a good interface roughness between a titanium silicide layer and a polysilicon layer.

According to an aspect of the present invention, there is provided to a method for forming a titanium polycide gate including the steps of: forming a gate oxide and a doped polysilicon layer over the semiconductor substrate, in turn; implanting impurity ions into the doped polysilicon layer to form an amorphous phase silicon layer in the surface of the polysilicon layer; forming an amorphous phase titanium silicide layer over the amorphous phase silicon layer; carrying out heat-treatment to transform the amorphous phase titanium silicide layer into a crystalline phase titanium silicide layer and to transform the amorphous phase silicon layer into the crystalline silicon layer; and patterning the crystalline phase titanium silicide layer, the polysilicon layer including the crystalline phase silicon layer and the gate oxide to form the titanium polycide gate.

BRIEF DESCRIPTION OF THE DRAWINGS

The objects and features of the invention may be understood with reference to the following detailed description of an illustrative embodiment of the invention, taken together with the accompanying drawings in which.

DETAILED DESCRIPTION OF THE INVENTION

Figure 1A:
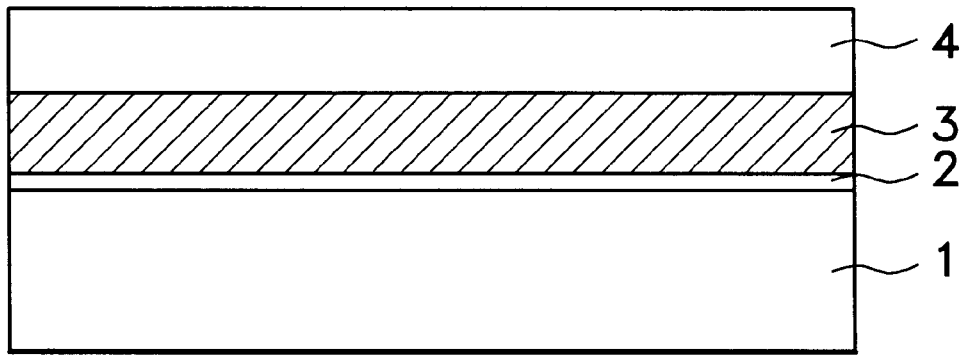
FIG. 1A to FIG. 1C are sectional views illustrating a method for forming a titanium polycide gate in the prior art.
Figure 1B:
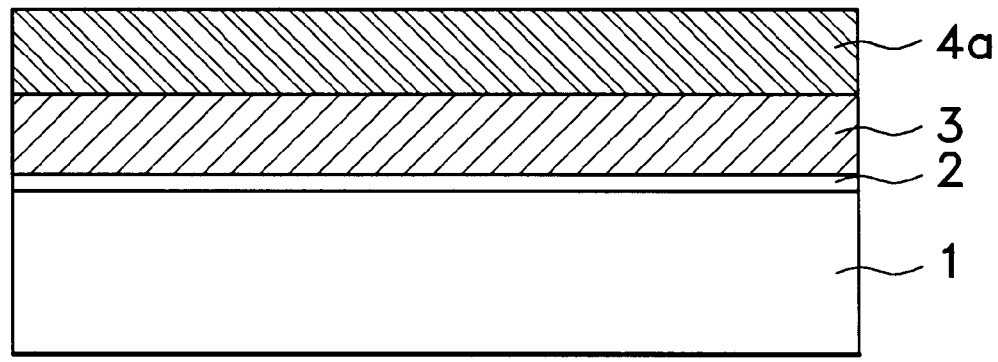
Figure 1C:
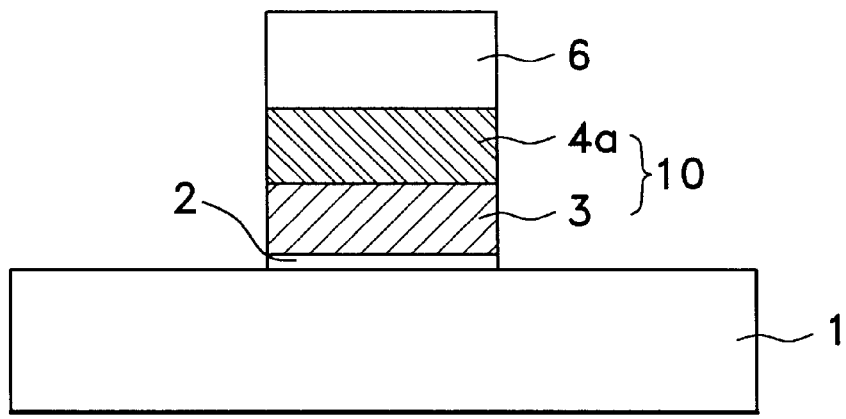
Figure 2:
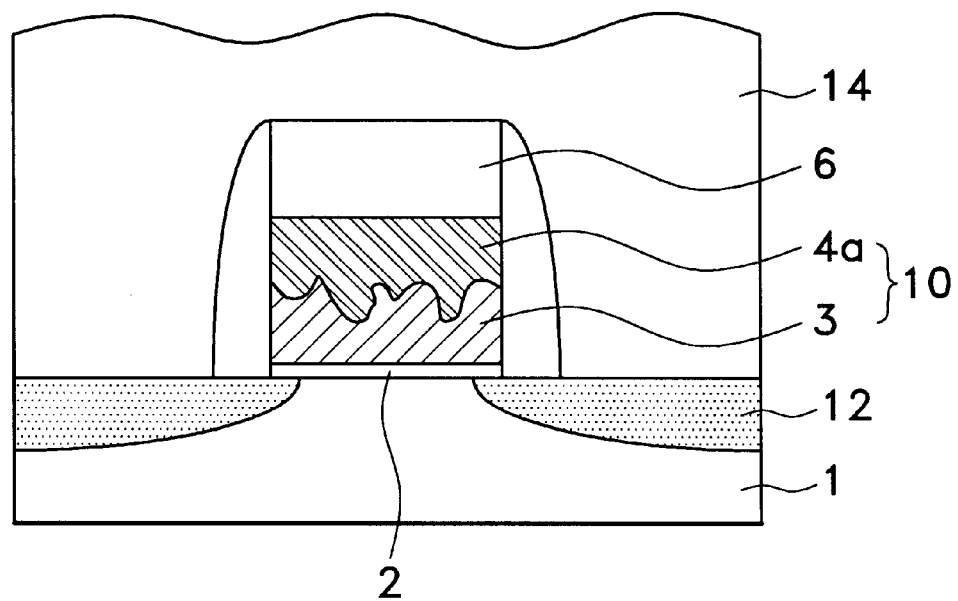
FIG. 2 is a sectional view illustrating drawbacks in the prior titanium polycide gate.
Figure 3A:
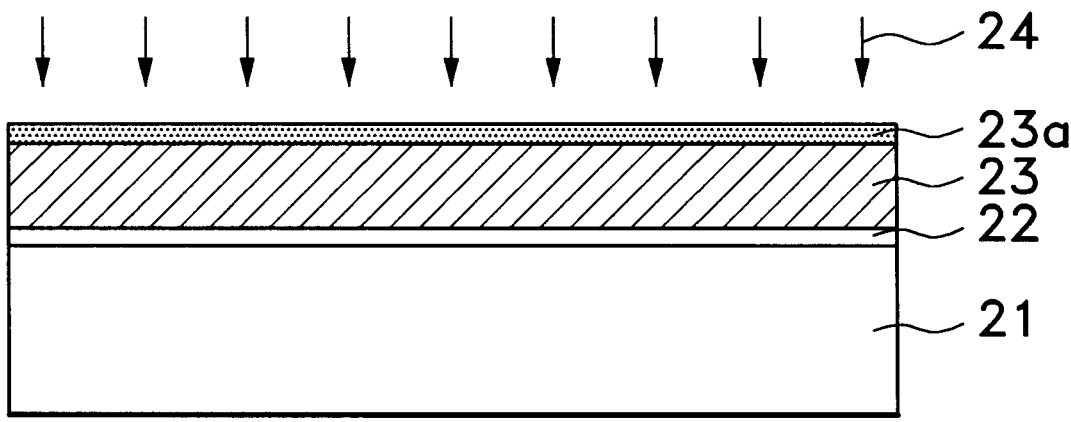
FIG. 3A to FIG. 3D are sectional views illustrating a method for forming a titanium polycide gate in accordance with an embodiment of the present invention.

FIG. 3A to FIG. 3D are sectional views illustrating a method for forming a titanium polycide gate in accordance with an embodiment of the present invention. Referring to FIG. 3A, a semiconductor substrate 21 is prepared and a gate oxide is formed by thermally oxidizing a surface of the substrate 21. A polysilicon layer 23 doped with phosphorous (P) or arsenic (As) is formed over the gate oxide 22 at a predetermined thickness. Impurities ions which is any one of Ge, Sb or As are implanted into the surface of the polysilicon layer 23 at a dose of $10^{14}$–$10^{15}$ ions/cm$^2$ with energy of 40–70keV and the portion of the polysilicon layer 23 becomes amorphous so that an amorphous silicon layer 23a is formed in the surface of the polysilicon layer 23.

Figure 3B:
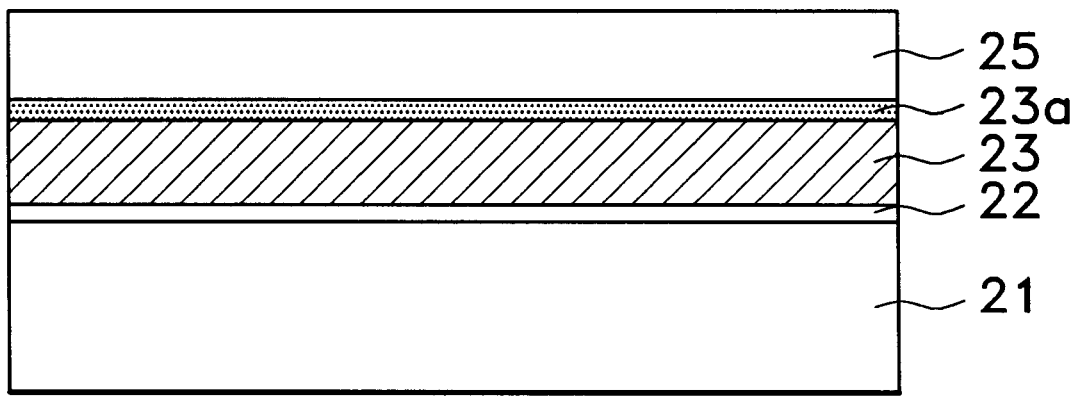

Referring to FIG. 3B, a titanium silicide layer 25 is formed on the amorphous silicon layer 23a at a desired thickness with PVD using TiSi$_x$ target. The titanium silicide layer 25 is amorphous phase.

Figure 3C:
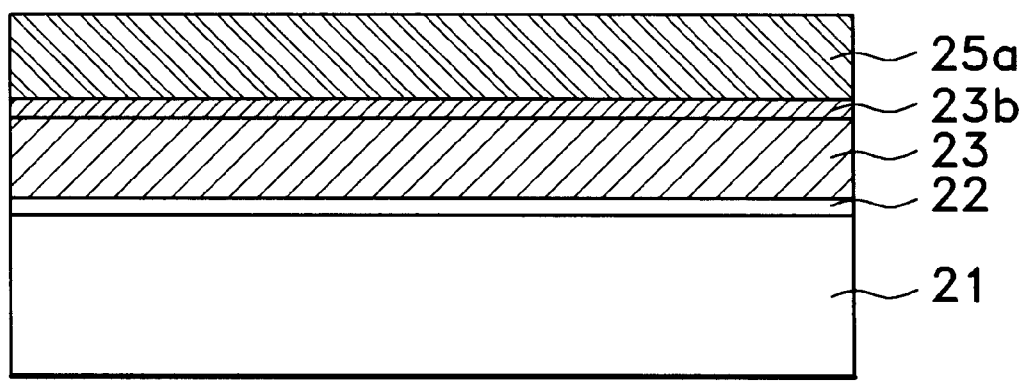

Referring to FIG. 3C, a rapid thermal annealing process (RTP) is carried out at a temperature of 700–1000° C. during 10–30 seconds so that the titanium silicide layer 25 of amorphous phase is transformed into a crystalline titanium silicide layer 25a. At this time, the amorphous silicon layer 23a is transformed into a crystalline silicon layer 23b.

Figure 3D:
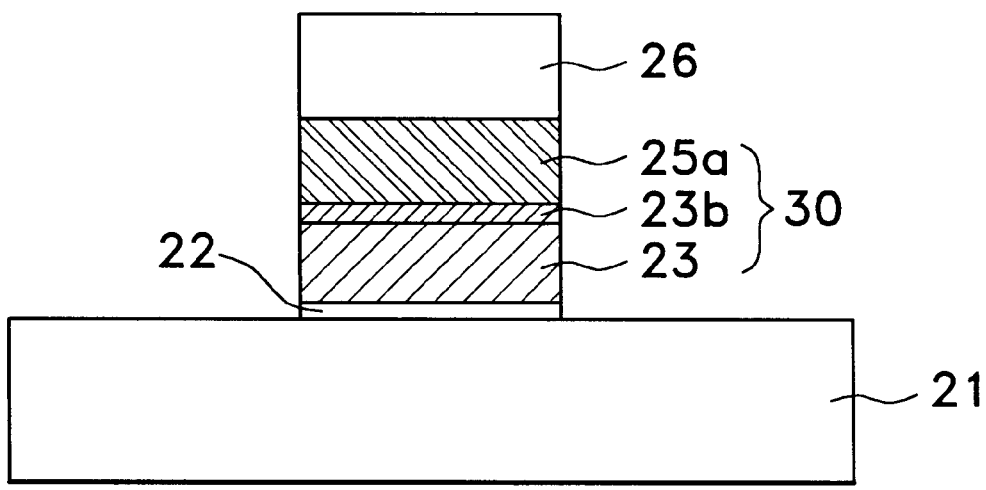

Referring to FIG. 3D, a mask pattern 26 being comprised of an oxide layer or a nitride layer is formed over the crystalline titanium silicide layer 25a and then the crystalline titanium silicide layer 25a, the polysilicon layer 23 including the crystalline silicon layer 23b and the gate oxide 22 are etched using the mask pattern 26 to form a titanium polycide gate 30.

In the titanium polycide gate 30 formed in the above described process, because the crystalline silicon layer 23b is formed with RTP, the grains of the crystalline silicon layer 23b is very small. It is because grains are rapidly grown in a short time. Accordingly, the crystalline silicon layer 23b which is contacted with the crystalline titanium silicide layer 25a, has a fine crystalline structure not a columnar structure of large grains. Therefore, although the following heat-treatments for forming a source/drain region and for planarizing an intermediate insulating layer are carried out, because there is few the material migration through grain boundaries of the crystalline silicon layer 23b, the interface roughness between the crystalline titanium silicide layer 25a and the crystalline silicon layer 23b is good. On the other hand, the crystalline silicon layer 23b and the polysilicon layer 23 have a good interface roughness and are not heavily influenced by the following heat-treatment.

According to the present invention, the amorphous titanium silicide layer is transformed into the crystalline titanium silicide layer as well as the underlying amorphous silicon layer is transformed into the crystalline silicon layer of fine grains and the reaction between the crystalline titanium silicide layer and the crystalline silicon layer can be minimized to improve the interface characteristics. Therefore, the characteristics and reliability of the titanium polycide gate is assured and then applicable to the high integration devices.

While the invention has been particularly shown and described with respect to preferred embodiment thereof, it will be understood by those skilled in the art that various changes in form and details may be made therein without departing from the spirit and the scope of the invention as defined by the following claims.

What is claimed is:

1. A method for forming a titanium polycide gate, comprising the steps of:

forming a gate oxide and a doped polysilicon layer over the semiconductor substrate, in turn;

implanting impurity ions into the doped polysilicon layer to form an amorphous phase silicon layer in a surface of the doped polysilicon layer;

forming an amorphous phase titanium silicide layer over the amorphous phase silicon layer;

carrying out heat-treatment to transform the amorphous phase titanium silicide layer into a crystalline phase titanium silicide layer and to transform the amorphous phase silicon layer into a crystalline phase silicon layer; and patterning the crystalline phase titanium silicide layer, the doped polysilicon layer including the crystalline phase silicon layer and the gate oxide to form the titanium polycide gate.

2. The method as claimed in claim, wherein the impurity ions are comprised of any one of Sb, Ge or As.

3. The method as claimed in claim 2, wherein the impurity ions are implanted at a dose of $10^{14}$–$10^{15}$ ions/cm$^2$ with energy of 40–70 keV.

4. The method as claimed in claim 1, wherein the heat-treatment is carried out with a rapid thermal process.

5. The method as claimed in claim 4, wherein the heat-treatment is carried out at a temperature of 700–1,000° C. during 10–30 seconds.

* * * * *